(12) United States Patent
Suh et al.

(10) Patent No.: US 6,280,580 B1
(45) Date of Patent: Aug. 28, 2001

(54) METHOD FOR MANUFACTURING A DOUBLE-SIDED HIGH-TEMPERATURE SUPERCONDUCTING OXIDE THIN FILM HAVING LARGE AREA

(75) Inventors: Jeong Dae Suh; Seok Kil Han; Kwang Yong Kang, all of Daejon-Shi (KR)

(73) Assignee: Electronics and Telecommunications Research Institute, Daejon-Shi (KR)

( * ) Notice: Subject to any disclaimer, the term of this patent is extended or adjusted under 35 U.S.C. 154(b) by 0 days.

(21) Appl. No.: 09/436,799

(22) Filed: Nov. 8, 1999

(30) Foreign Application Priority Data

Nov. 23, 1998 (KR) .................................................. 98-50207

(51) Int. Cl.[7] .................................................. C23C 14/34
(52) U.S. Cl. ...................................... 204/192.26; 505/475
(58) Field of Search ........................ 204/192.24, 298.26, 204/298.12, 298.09, 298.25; 505/475, 476

(56) References Cited

U.S. PATENT DOCUMENTS

| | | | |
|---|---|---|---|
| 4,828,664 | * 5/1989 | Dietrich et al. | 204/192.24 |
| 4,866,032 | 9/1989 | Fujimori et al. . | |
| 5,126,318 | 6/1992 | Gavaler et al. . | |
| 5,140,004 | * 8/1992 | Tanaka et al. | 204/192.24 |
| 5,196,400 | 3/1993 | Chen et al. . | |

OTHER PUBLICATIONS

H. Koch et al., Hollow cathode discharge sputtering device for uniform large area thin film deposition, Jul. 1991, pp. 2374–2377.

Th. Schurig et al., Large area YBCO thin film deposition using linear hollow cathode discharge sputtering, Physica C 262 (1996), pp. 89–97.

R.A. Rao et al., Uniform deposition of $Yba_2Cu_3O_7$ thin films over an 8 inch diameter area by a 90° off–axis sputtering technique, Appl. Phys. Lett. Dec. 16, 1996, pp. 3911–3913.

\* cited by examiner

Primary Examiner—Nam Nguyen
Assistant Examiner—Gregg Cantelmo
(74) Attorney, Agent, or Firm—Cohen, Pontani, Lieberman & Pavane

(57) ABSTRACT

A method of manufacturing a double-sided high-temperature superconducting oxide thin film comprises the steps of placing two sintered material targets in a thin film deposition chamber; attaching a single crystal oxide substrate to a substrate supporter piercing through a separator of the thin film deposition chamber; rotating the single crystal oxide substrate, placing two substrate heaters toward both surfaces of the single crystal oxide substrate, and heating the single crystal oxide substrate thereby; applying a power to sputter to the sintered material targets; and depositing a target material on both surfaces of the single crystal oxide substrate by having plasma generated from the two sintered material targets contact thereon.

6 Claims, 3 Drawing Sheets

METHOD FOR MANUFACTURING A DOUBLE-SIDED HIGH-TEMPERATURE SUPERCONDUCTING OXIDE THIN FILM HAVING LARGE AREA

BACKGROUND OF THE INVENTION

1. Field of the Invention

The present invention relates to a method of manufacturing a large-area, double-sided, high-temperature superconducting oxide thin film using a sputtering deposition technique by which a large-area, high-temperature superconducting oxide thin film is formed on the both surfaces of a large-area single crystal oxide substrate.

2. Information Disclosure Statement

In the prior art of sputtering technique, to produce a large-area, high-temperature superconducting oxide thin film of above 2 inches of diameter, various types of production methods have been proposed such as; a method of producing a large-area thin film on a metal plate by rotating a circular plate type target (U.S. Pat. No. 4,866,032), a method of producing a large-area thin film by attaching a target to the outside of a cylindrical type target supporter (U.S. Pat. No. 5,196,400), and a method of producing a large-area thin film by deposition using a hollow rectangular type cathode target and moving a substrate parallel with the surface of the target [H. Koch, et al. Journal of Vacuum Science and Technology A.9(4), 2374 (1991), Th. Schuring, et al. Physica C 262, 89 (1996)]. By these methods, however, a high-temperature superconducting thin film can be deposited only on one surface of a large-area single crystal substrate.

To apply a high-temperature superconducting thin film to a digital electronic device and a microwave device, however, it is essential to develop a technique by which a thin film can be formed not only on one surface but also on both surfaces of a large-area single crystal oxide substrate.

SUMMARY OF THE INVENTION

It is therefore the object of the present invention is to provide a method of manufacturing a large-area, double-sided, high-temperature superconducting oxide thin film using a sputtering deposition technique by which a high-temperature superconducting oxide thin film of above 2 inches of diameter is formed on both surfaces of a large-area single crystal oxide substrate.

To achieve the object, the manufacturing method in accordance with the present invention comprises the steps of placing two high-temperature superconducting oxide of $YBa_2Cu_3O_{7-x}$ sintered material targets in a thin film deposition chamber, attaching a large-area single crystal oxide substrate of MgO, $SrTiO_3$, $LaAlO_3$, $Al_2O_3$, $LaSrGaO_4$, which has 2–3 inches diameter, to a substrate supporter piercing through the separator of the thin film deposition chamber, having the large-area single crystal oxide substrate rotate, with the separator of the deposition chamber locating on its center-line, by the rotation of the substrate supporter, placing two substrate heaters toward both surfaces of the large-area single crystal oxide substrate and heating the large-area single crystal oxide substrate thereby, applying a voltage between the sintered material targets and the large-area single crystal oxide substrate, and depositing a high-temperature superconducting target material on both surfaces of the large-area single crystal oxide substrate by having the plasma generated from the two high-temperature superconducting targets contact thereon.

BRIEF DESCRIPTION OF THE DRAWINGS

The above object and other advantages of the present invention will become more apparent by describing in detail the preferred embodiment of the present invention with reference to the attached drawings in which.

Similar reference characters refer to similar parts in the several views of the drawings.

DETAILED DESCRIPTION OF THE INVENTION

Referring to appended drawings, detailed description of a method for manufacturing a large-area, double-sided, high-temperature oxide superconducting thin film in accordance with the embodiments of the present invention is now described.

Figure 1:
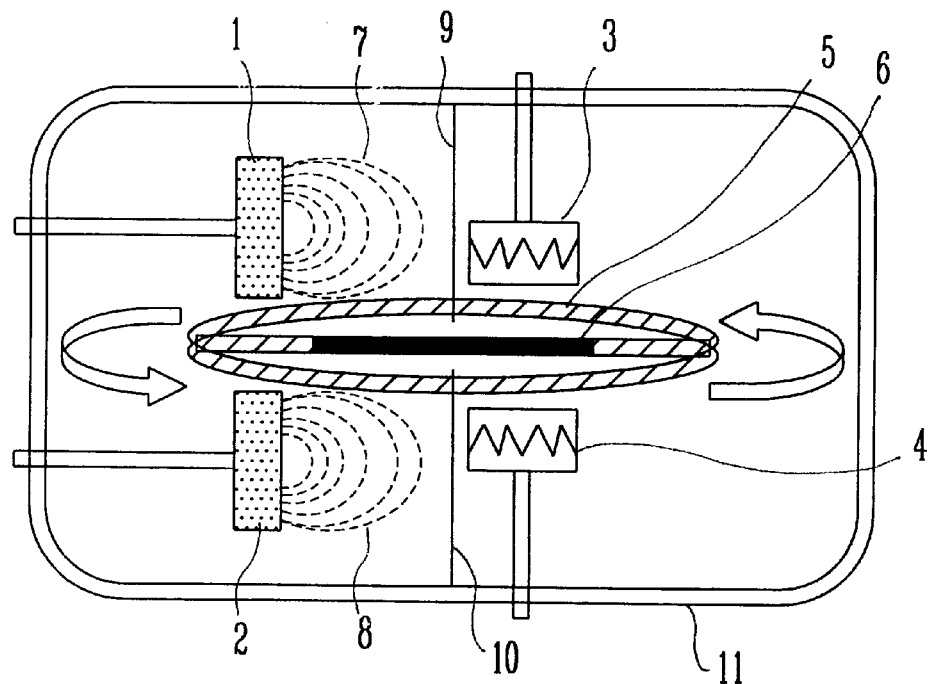
FIG. 1 is a view illustrating a method of depositing a large-area, double-sided, high-temperature superconducting oxide thin film by placing two disk type sputtering targets perpendicular to the surface of the deposition substrate.

FIG. 1 is a view illustrating a method of depositing a large-area, double-sided, high-temperature superconducting oxide thin film by placing two disk type sputtering targets perpendicular to the surface of the deposition substrate.

As illustrated in FIG. 1, the first embodiment of a method for manufacturing a large-area double-sided thin film in accordance with the present invention comprises the steps of placing two disk type sintered material targets 1 and 2 perpendicular to the surface of the large-area single crystal oxide substrate 6 in the thin film deposition chamber 11, wherein the sintered material targets 1 and 2 comprise a high-temperature superconducting oxide material of $Yba_2CU_3O_{7-x}$ and the large-area single crystal oxide substrate 6 comprises oxide materials such as MgO, $SrTiO_3$, $LaAlO_3$, $Al_2O_3$, $LaSrGaO_4$, attaching the large-area single crystal oxide substrate 6 to the rotational substrate supporter 5 piercing through the separator 9 and 10 of the deposition chamber, having the large-area single crystal oxide substrate 6 rotate, with the separator 9 and 10 of the deposition chamber locating on its center-line, by the rotation of the substrate supporter 5, placing two substrate heaters 3 and 4 parallel with both surfaces of the large-area single crystal oxide substrate 6 to heat the large-area single crystal oxide substrate 6 at both sides, maintaining the temperature of the large-area single crystal oxide substrate 6 between 700° C. and 800° C. in which a crystal state of $YBa_2Cu_3O_{7-x}$ is formed, injecting sputtering gas into the thin film deposition chamber 11 to maintain the pressure between 100 mTorr and 300 mTorr, applying a sputtering power to the sintered material targets 1 and 2, and generating plasmas 7 and 8 and depositing the target material on both surfaces of the large-area single crystal oxide substrate 6 thereby.

Figure 2:
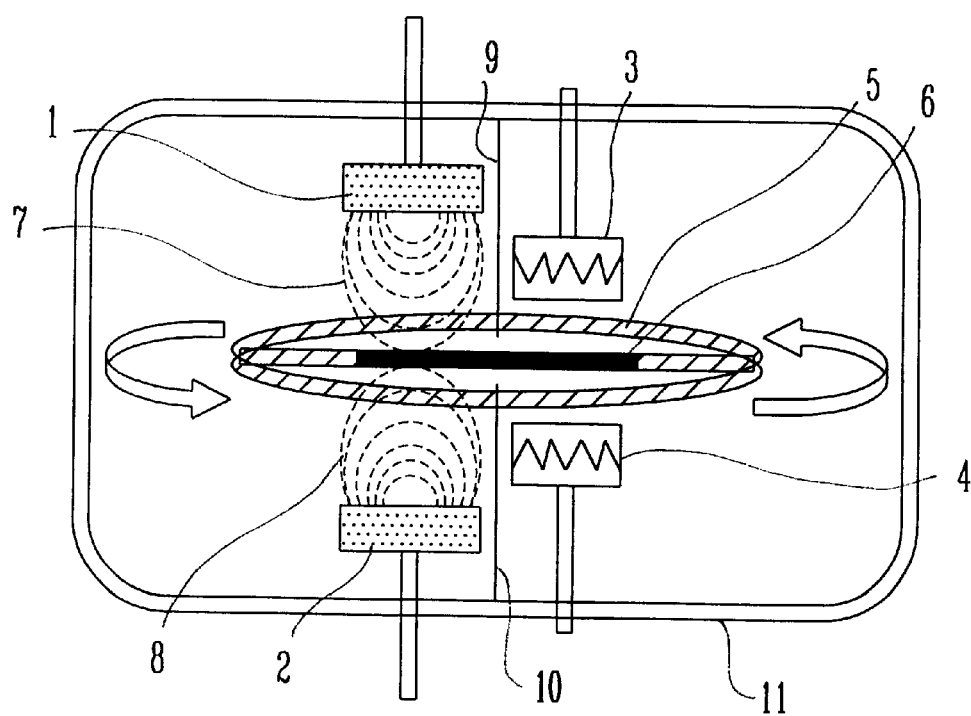
FIG. 2 is a view illustrating a method of depositing a large-area, double-sided, high-temperature superconducting oxide thin film by placing two disk type sputtering targets parallel to the surface of the deposition substrate.

FIG. 2 is a view illustrating a method of depositing a large-area, double-sided, high-temperature superconducting oxide thin film by placing two disk type sputtering targets parallel to the surface of the deposition substrate.

As illustrated in FIG. 2, the second embodiment of the method for manufacturing a large-area double-sided thin film in accordance with the present invention comprises the steps of placing two disk type sintered material targets 1 and 2 parallel to the surface of the large-area single crystal oxide substrate 6 in the thin film deposition chamber 11, wherein the sintered material targets 1 and 2 comprise a high-temperature superconducting oxide material of $YBa_2Cu_3O_{7-x}$ and the large-area single crystal oxide substrate 6 comprises oxide materials such as MgO, $SrTiO_3$, $LaAlO_3$, $Al_2O_3$, $LaSrGaO_4$, attaching the large-area single crystal oxide substrate 6 to the rotational substrate supporter 5 piercing through the separator 9 and 10 of the deposition chamber, having the large-area single crystal oxide substrate 6 rotate, with the separator 9 and 10 of the deposition chamber locating on its center-line, by the rotation of the substrate supporter 5, placing two substrate heaters 3 and 4 parallel with both surfaces of the large-area single crystal oxide substrate 6 to heat the large-area single crystal oxide substrate 6 at both sides, maintaining the temperature of the large-area single crystal oxide substrate 6 between 700° C. and 800° C. in which a crystal state of $YBa_2Cu_3O_{7-x}$ is formed, injecting sputtering gas into the thin film deposition chamber 11 to maintain the pressure between 100 mTorr and 300 mTorr, applying a sputtering power to the sintered material targets 1 and 2, and generating plasmas 7 and 8 and depositing the target material on both surfaces of the large-area single crystal oxide substrate 6 thereby.

Figure 3:
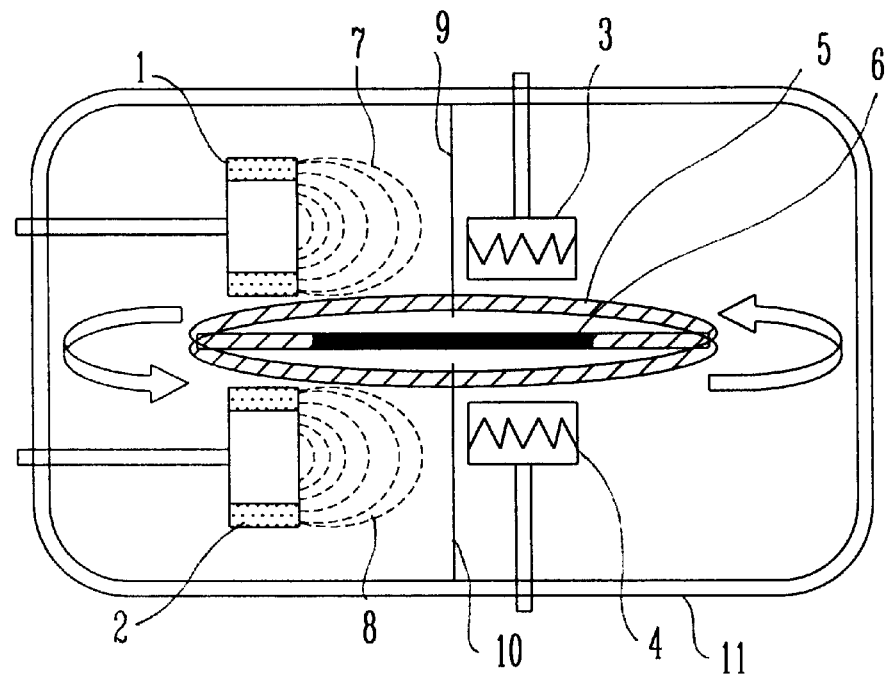
FIG. 3 is a view illustrating a method of depositing a large-area, double-sided, high-temperature superconducting oxide thin film by placing two hollow cylinder type sputtering targets perpendicular to the surface of the deposition substrate.

FIG. 3 is a view illustrating a method of depositing a large-area, double-sided, high-temperature superconducting oxide thin film by placing two hollow cylinder type sputtering targets perpendicular to the surface of the deposition substrate.

As illustrated in FIG. 3, the third embodiment of the method for manufacturing a large-area double-sided thin film in accordance with the present invention comprises the steps of placing two hollow cylinder type sintered material targets 1 and 2 perpendicular to the surface of the large-area single crystal oxide substrate 6 in the thin film deposition chamber 11, wherein the sintered material targets 1 and 2 comprise a high-temperature superconducting oxide material of $YBa_2Cu_3O_{7-x}$ and the large-area single crystal oxide substrate 6 comprises oxide materials such as MgO, $SrTiO_3$, $LaAlO_3$, $Al_2O_3$, $LaSrGaO_4$, attaching the large-area single crystal oxide substrate 6 to the rotational substrate supporter 5 piercing through the separator 9 and 10 of the deposition chamber, having the large-area single crystal oxide substrate 6 rotate, with the separator 9 and 10 of the deposition chamber locating on its center-line, by the rotation of the substrate supporter 5, placing two substrate heaters 3 and 4 parallel with both surfaces of the large-area single crystal oxide substrate 6 to heat the large-area single crystal oxide substrate 6 at both sides, maintaining the temperature of the large-area single crystal oxide substrate 6 between 700° C. and 800° C. in which a crystal state of $YBa_2Cu_3O_{7-x}$ is formed, injecting sputtering gas into the thin film deposition chamber 11 to maintain the pressure between 100 mTorr and 300 mTorr, applying a sputtering power to the sintered material targets 1 and 2, and generating plasmas 7 and 8 and depositing the target material on both surfaces of the large-area single crystal oxide substrate 6 thereby.

Figure 4:
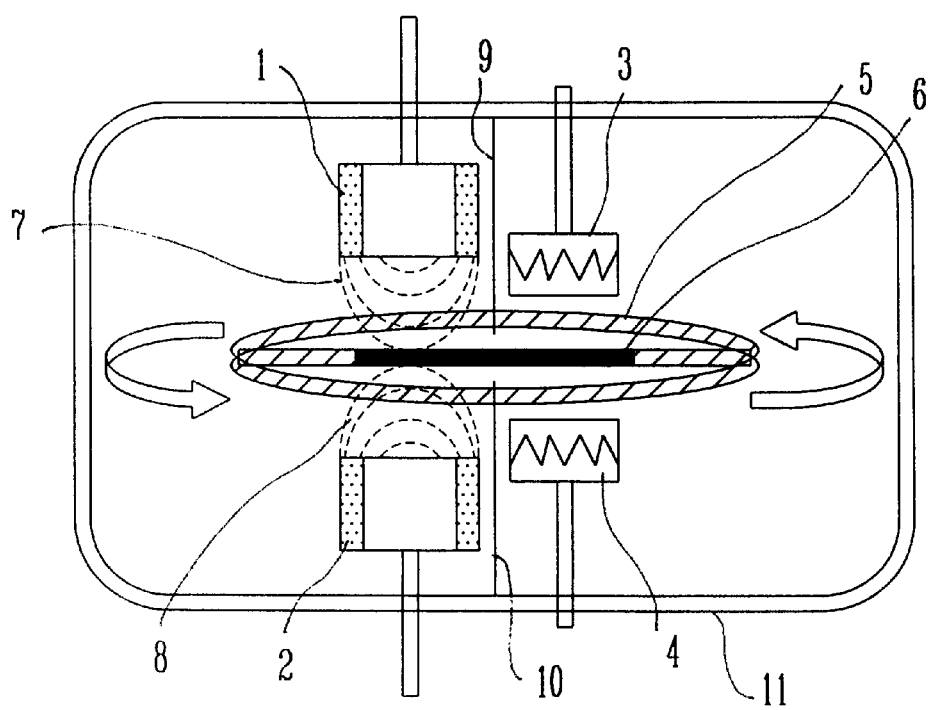
FIG. 4 is a view illustrating a method of depositing a large-area, double-sided, high-temperature superconducting oxide thin film by placing two hollow cylinder type sputtering targets parallel to the surface of the deposition substrate.

FIG. 4 is a view illustrating a method of depositing a large-area, double-sided, high-temperature superconducting oxide thin film by placing two hollow cylinder type sputtering targets parallel to the surface of the deposition substrate.

As illustrated in FIG. 4, the fourth embodiment of the method for manufacturing a large-area double-sided thin film in accordance with the present invention comprises the steps of placing two hollow cylinder type sintered material targets 1 and 2 parallel to the surface of the large-area single crystal oxide substrate 6 in the thin film deposition chamber 11, wherein the sintered material targets 1 and 2 comprise a high-temperature superconducting oxide material of $YBa_2Cu_3O_{7-x}$ and the large-area single crystal oxide substrate 6 comprises oxide materials such as MgO, $SrTiO_3$, $LaAlO_3$, $Al_2O_3$, $LaSrGaO_4$, attaching the large-area single crystal oxide substrate 6 to the rotational substrate supporter 5 piercing through the separator 9 and 10 of the deposition chamber, having the large-area single crystal oxide substrate 6 rotate, with the separator 9 and 10 of the deposition chamber locating on its center-line, by the rotation of the substrate supporter 5, placing two substrate heaters 3 and 4 parallel to both surfaces of the large-area single crystal oxide substrate 6 to heat the large-area single crystal oxide substrate 6 at both sides, maintaining the temperature of the large-area single crystal oxide substrate 6 between 700° C. and 800° C. in which a crystal state of $YBa_2Cu_3O_{7-x}$ is formed, injecting sputtering gas into the thin film deposition chamber 11 to maintain the pressure between 100 mTorr and 300 mTorr, applying a sputtering power to the sintered material targets 1 and 2, and generating plasmas 7 and 8 and depositing the target material on both surfaces of the large-area single crystal oxide substrate 6 thereby.

Figure 5:
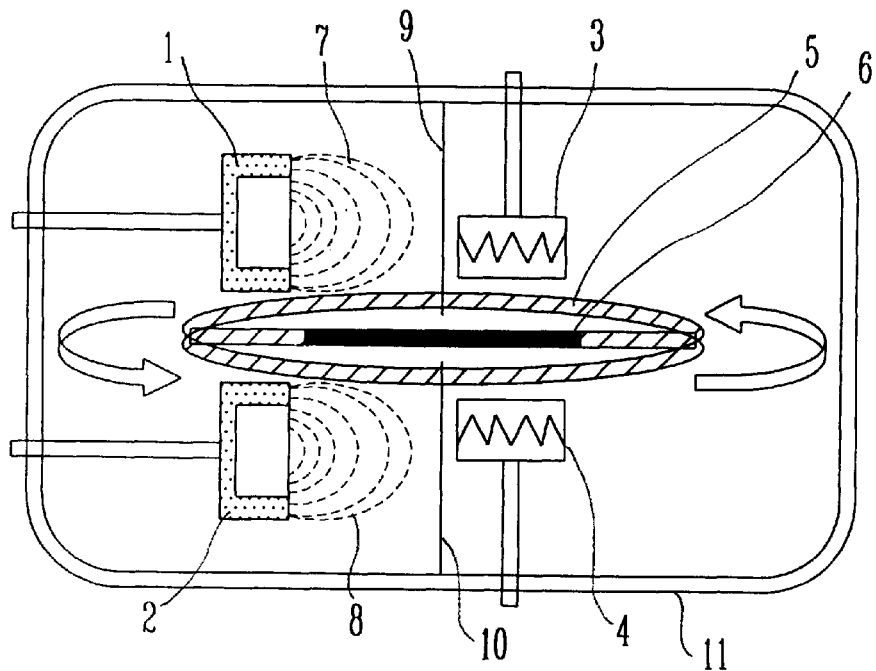
FIG. 5 is a view illustrating a method of depositing a large-area, double-sided, high-temperature superconducting oxide thin film by placing two partially-hollow cylinder type sputtering targets, having hollow sides toward the substrate, perpendicular to the surface of the deposition substrate.

FIG. 5 is a view illustrating a method of depositing a large-area, double-sided, high-temperature superconducting oxide thin film by placing two partially-hollow cylinder type sputtering targets, having hollow sides toward the substrate, perpendicular to the surface of the deposition substrate.

As illustrated in FIG. 5, the fifth embodiment of the method for manufacturing a large-area double-sided thin film in accordance with the present invention comprises the steps of placing two partially-hollow cylinder type sputtering targets 1 and 2 having hollow sides toward the substrate, perpendicular to the surface of the large-area single crystal oxide substrate 6 in the thin film deposition chamber 11, wherein the sintered material targets 1 and 2 comprise a high-temperature superconducting oxide material of $YBa_2Cu_3O_{7-x}$ and the large-area single crystal oxide substrate 6 comprises oxide materials such as MgO, $SrTiO_3$, $LaAlO_3$, $Al_2O_3$, $LaSrGaO_4$, attaching the large-area single crystal oxide substrate 6 to the rotational substrate supporter 5 piercing through the separator 9 and 10 of the deposition chamber, having the large-area single crystal oxide substrate 6 rotate, with the separator 9 and 10 of the deposition chamber locating on its center-line, by the rotation of the substrate supporter 5, placing two substrate heaters 3 and 4 parallel to both surfaces of the large-area single crystal oxide substrate 6 to heat the large-area single crystal oxide substrate 6 at both sides, maintaining the temperature of the large-area single crystal oxide substrate 6 between 700° C. and 800° C. in which a crystal state of $YBa_2Cu_3O_{7-x}$ is formed, injecting sputtering gas into the thin film deposition chamber 11 to maintain the pressure between 100 mTorr and 300 mTorr, applying a sputtering power to the sintered material targets 1 and 2, and generating plasmas 7 and 8 and depositing the target material on both surfaces of the large-area single crystal oxide substrate 6 thereby.

Figure 6:
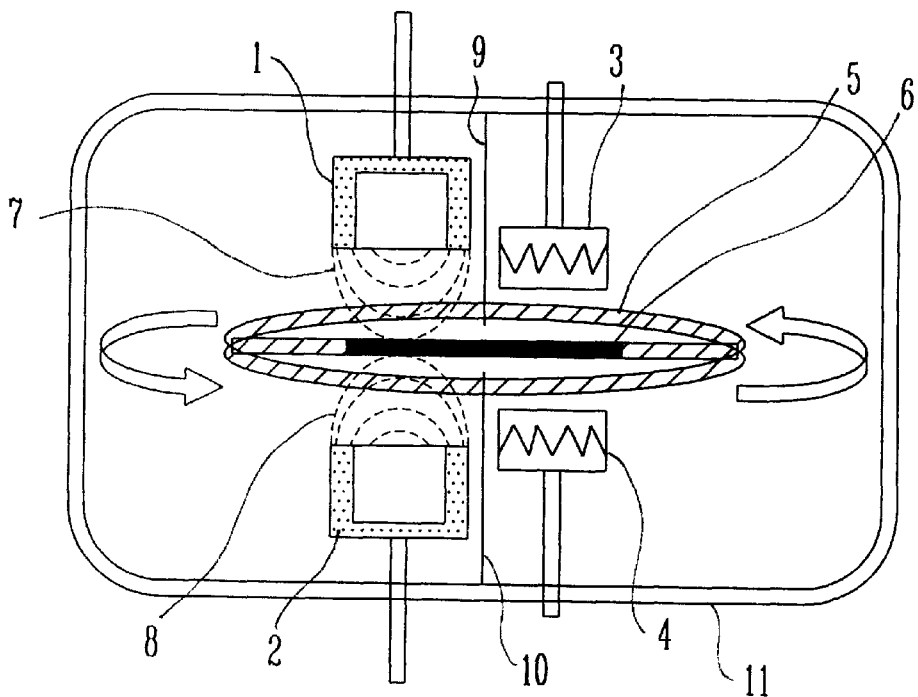
FIG. 6 is a view illustrating a method of depositing a large-area, double-sided, high-temperature superconducting oxide thin film by placing two partially-hollow cylinder type sputtering targets, having hollow sides toward the substrate, parallel to the surface of the deposition substrate.

FIG. 6 is a view illustrating a method of depositing a large-area, double-sided, high-temperature superconducting oxide thin film by placing two partially-hollow cylinder type sputtering targets, having hollow sides toward the substrate, parallel to the surface of the deposition substrate.

As illustrated in FIG. 6, the sixth embodiment of the method for manufacturing a large-area double-sided thin film in accordance with the present invention comprises the steps of placing two partially-hollow cylinder type sputtering targets 1 and 2 having hollow sides toward the substrate, parallel to the surface of the large-area single crystal oxide substrate 6 in the thin film deposition chamber 11, wherein the sintered material targets 1 and 2 comprise a high-temperature superconducting oxide material of $YBa_2Cu_3O_{7-x}$ and the large-area single crystal oxide substrate 6 comprises oxide materials such as MgO, $SrTiO_3$, $LaAlO_3$, $Al_2O_3$, $LaSrGaO_4$, attaching the large-area single crystal oxide substrate 6 to the rotational substrate supporter 5 piercing through the separator 9 and 10 of the deposition chamber, having the large-area single crystal oxide substrate 6 rotate, with the separator 9 and 10 of the deposition chamber locating on its center-line, by the rotation of the substrate supporter 5, placing two substrate heaters 3 and 4 parallel to both surfaces of the large-area single crystal oxide substrate 6 to heat the large-area single crystal oxide substrate 6 at both sides, maintaining the temperature of the large-area single crystal oxide substrate 6 between 700° C. and 800° C. in which a crystal state of $YBa_2CU_3O_{7-x}$ is formed, injecting sputtering gas into the thin film deposition chamber 11 to maintain the pressure between 100 mTorr and 300 mTorr, applying a sputtering power to the sintered material targets 1 and 2, and generating plasmas 7 and 8 and depositing the target material on both surfaces of the large-area single crystal oxide substrate.

Depending on the sintered material target shape and configuration, large area thin film deposition rate is quite different.

In the case of sintered material target shape, large area thin film deposition rates increase in regular sequence of the disk, hollow cylinder, and partially hollow cylinder.

Also, In the case of sintered material target configuration for generating a perpendicular (FIGS. 1, 3 and 5) and parallel (FIGS. 2, 4 and 6) plasma with respect to the single crystal oxide substrate.

Large area thin film deposition rate by using a parallel plasma is higher than the perpendicular plasma configuration.

Accordingly, a large-area, double-sided, high-temperature superconducting oxide thin film can be obtained by the method of manufacturing the thin film deposition in accordance with the present invention.

Since those having ordinary knowledge and skill in the art of the present invention will recognize additional modifications and applications within the scope thereof. the present invention is not limited to the embodiments and drawings described above.

What is claimed is:

1. A method of manufacturing a double-sided high-temperature superconducting oxide thin film, comprising the steps of:

placing two sintered material targets in a thin film deposition chamber;

attaching a single crystal oxide substrate to a substrate supporter piercing through a separator of the thin film deposition chamber;

rotating said single crystal oxide substrate;

placing two substrate heaters toward both surfaces of said single crystal oxide substrate, and heating said single crystal oxide substrate thereby, applying a power to sputter to said sintered material targets; and depositing a target material on both surfaces of said single crystal oxide substrate by having plasma generated from said two sintered material targets contact thereon.

2. The method of manufacturing a double-sided high-temperature superconducting oxide thin film as claimed in claim 1, wherein said single crystal oxide substrate is any one selected from the group consisting of $M_gO$, $SrTiO_3$, $LaAlO_3$, $Al_2O_3$ and $LaSrGaO_4$.

3. The method of manufacturing a double-sided high-temperature superconducting oxide thin film as claimed in claim 1, wherein said sintered material targets are placed perpendicularly to both surfaces of said single crystal oxide substrate.

4. The method of manufacturing a double-sided high-temperature superconducting oxide thin film as claimed in claim 1, wherein said sintered material targets are placed parallel with both surfaces of said single crystal oxide substrate.

5. The method of manufacturing a double-sided high-temperature superconducting oxide thin film as claimed in claim 1, wherein said sintered material targets are any one type selected from the group consisting of a disk type, hollow cylinder type and partially-hollow cylinder type having hollow sides toward both surfaces of said crystal oxide substrate.

6. The method of manufacturing a double-sided high-temperature superconducting oxide thin film as claimed in claim 1, wherein said substrate heaters are placed parallel with both surfaces of said single crystal oxide substrate.

* * * * *